(12) United States Patent
Chiu et al.

(10) Patent No.: US 12,347,709 B2
(45) Date of Patent: Jul. 1, 2025

(54) RETICLE POD WITH QUICK-RELEASE SUPPORT MECHANISM

(71) Applicant: GUDENG PRECISION INDUSTRIAL CO., LTD., New Taipei (TW)

(72) Inventors: Ming-Chien Chiu, New Taipei (TW); Chia-Ho Chuang, New Taipei (TW); Kuo-Hua Lee, New Taipei (TW); Shu-Hung Lin, New Taipei (TW); Chia-Ch Lin, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 461 days.

(21) Appl. No.: 17/195,783

(22) Filed: Mar. 9, 2021

(65) Prior Publication Data
US 2022/0238362 A1    Jul. 28, 2022

(30) Foreign Application Priority Data
Jan. 28, 2021  (TW) .................. 110103159

(51) Int. Cl.
*H01L 21/673* (2006.01)

(52) U.S. Cl.
CPC .. *H01L 21/67359* (2013.01); *H01L 21/67379* (2013.01); *H01L 21/67386* (2013.01)

(58) Field of Classification Search
CPC ......... H01L 21/67359; H01L 21/67379; H01L 21/67386; H01L 21/67373; H01L 21/67353; H01L 21/67383; G03F 1/00; G03F 1/66

USPC ........................................... 206/710
See application file for complete search history.

(56) References Cited

U.S. PATENT DOCUMENTS

| | | | | |
|---|---|---|---|---|
| 2,725,087 A | * | 11/1955 | Potter ................. | B65D 88/522 |
| | | | | 220/666 |
| 5,604,958 A | * | 2/1997 | Anscher .............. | A45C 7/0086 |
| | | | | 24/165 |
| 6,216,873 B1 | * | 4/2001 | Fosnight ............. | G03F 1/66 |
| | | | | 206/454 |
| 7,581,639 B2 | * | 9/2009 | Chiu ................ | H01L 21/67369 |
| | | | | 206/480 |
| 7,931,146 B2 | * | 4/2011 | Chiu ..................... | G03F 1/66 |
| | | | | 206/454 |

(Continued)

FOREIGN PATENT DOCUMENTS

| JP | 2011166065 A | 8/2011 |
|---|---|---|
| KR | 200213357 Y1 | 4/2001 |
| KR | 101185750 B1 | 9/2012 |

*Primary Examiner* — Orlando E Aviles
*Assistant Examiner* — Jenine Pagan
(74) *Attorney, Agent, or Firm* — troutman pepper locke; Tim Tingkang Xia, Esq.

(57) ABSTRACT

The present invention provides a reticle pod comprising a lower cover and a support mechanism. The lower cover includes a carrying surface and a plurality of securing seats distributed on the carrying surface. The support mechanism includes a supporting portion extending upward for supporting a reticle or a reticle carrier, and a securing portion opposite the supporting portion, wherein the securing portion is detachably connected with a corresponding securing seat, so that the support mechanism can be selectively installed on the lower cover.

10 Claims, 15 Drawing Sheets

(56) References Cited

U.S. PATENT DOCUMENTS

| | | | |
|---|---|---|---|
| 2007/0085992 A1* | 4/2007 | Chiu | H01L 21/67359 355/75 |
| 2009/0038985 A1* | 2/2009 | Wang | G03F 7/70858 206/710 |
| 2010/0126904 A1* | 5/2010 | Cheng | H01L 21/67353 414/217.1 |
| 2013/0010277 A1 | 1/2013 | del Puerto et al. | |
| 2020/0144086 A1* | 5/2020 | Tieben | H01L 21/67346 |

* cited by examiner

RETICLE POD WITH QUICK-RELEASE SUPPORT MECHANISM

CROSS-REFERENCE TO RELATED APPLICATIONS

This non-provisional application claims priority under 35 U.S.C. § 119(a) on Patent Application No(s). 110103159 filed in Taiwan on Jan. 28, 2021, the entire contents of which are hereby incorporated by reference.

FIELD OF THE INVENTION

The present disclosure relates to a reticle pod, and more particularly, to a reticle pod with a quick-release mechanism.

DESCRIPTION OF THE PRIOR ART

Reticles are placed in reticle pods for transportation during manufacturing processes in the semiconductor industry. When a reticle is placed inside a prior art reticle pod, a slope, sphere or cylinder of a support mechanism supporting the reticle may have its abutting surface (which abuts against the reticle) worn down due to recurrent collisions. Such collisions may further wear down the support mechanism and result in unwanted particles. Typically, when the wear is severe, the only solution is to replace the reticle pod, which would be a waste of resources.

Therefore, an improved reticle pod is needed to address the above-described problem related to particles resulting from the wear of support mechanisms, and to reduce the waste of resources as well as manufacturing costs.

SUMMARY OF THE INVENTION

The invention provides a reticle pod with quick-release mechanism in order to solve foregoing problems such as particles produced from the abutting surface of a reticle through frequent wearing and the hardware waste.

The invention provides a reticle pod including a lower cover having a carrying surface and a plurality of mounting seats extending from the carrying surface; and a support mechanism having a supporting member extending upward for supporting a reticle or a reticle carrier and a mounting member opposite to the supporting member. The mounting member is configured to detachably connected to the corresponding one of the mounting seats such that the support mechanism is optionally loaded to the lower cover.

In one embodiment, the mounting member has at least one flexible leg with at least one holding member provided at a distal end of the leg, the corresponding mounting seat has at least one notch configured to receive and secure the holding member of the flexible leg.

In one embodiment, the mounting member is configured to connect to the corresponding mounting seat by threading, the mounting seat is a threaded post extending upward from the carrying surface.

In one embodiment, the mounting member is configured to connect to the corresponding mounting seat by a male-female connection to avoid the support mechanism from rotating relatively to the corresponding mounting seat.

In one embodiment, the mounting member is a female connector and the corresponding mounting seat is a male connector.

In one embodiment, the supporting member includes at least one first supporting post for contacting a bottom of the reticle and at least one second supporting post for limiting a side displacement of the reticle.

The invention provides another reticle pod including an upper cover having an abutting surface and a plurality of upper-cover mounting seats located on the abutting surface; a lower cover having a carrying surface and a plurality of lower-cover mounting seats located on the carrying surface; at least one first support mechanism having a supporting member extending upward for supporting a bottom of a reticle or a reticle carrier and a mounting member opposite to the supporting member, wherein the mounting member is configured to detachably connect to the corresponding lower-cover seat such that the first support mechanism is optionally loaded to the lower cover; and at least one second support mechanism having an abutting portion for abutting a top of the reticle or the reticle carrier and a joint portion connecting with the abutting portion, wherein the joint portion is configured to detachably connect to the corresponding upper-cover mounting seat such that the second support mechanism is optionally loaded to the upper cover.

In one embodiment, the upper-mounting seat has multiple protruding wing portions that is coupled to the corresponding joint portion.

In one embodiment, the joint portion of the second support mechanism has an opening defined therethrough, the opening has a first channel that allows the corresponding upper-cover mounting seat enters therein or departs therefrom, the opening has a second channel that allows the corresponding upper-cover mounting seat rotates relatively to the opening.

In one embodiment, the opening has at least one first rib, the upper-cover mounting seat has at least one second rib, the opening is shaped to allow the second rib slides over the first rib along a first rotation direction but prohibit the second rib rotates along a second rotation direction.

The present invention further provides a reticle pod including an upper cover having an abutting surface and a plurality of upper-cover mounting seats located on the abutting surface; a lower cover having a carrying surface and a plurality of lower-cover mounting seats located on the carrying surface; at least one support mechanism for contacting a bottom or a top of a reticle or a reticle carrier, the support mechanism is configured to rotatably detachably connected to the corresponding upper-cover mounting seat or the corresponding lower-cover mounting seat.

In one embodiment, the upper-cover mounting seat has multiple protruding wing portions.

In one embodiment, the support mechanism has an abutting portion for abutting a top of the reticle and a joint portion connecting with the abutting portion, the joint portion has an opening defined therethrough, the opening has a first channel that allows the corresponding upper-cover mounting seat enters therein or departs therefrom, the opening has a second channel that allows the corresponding upper-cover mounting seat rotates relatively to the opening.

In one embodiment, the opening has at least one first rib, the upper-cover mounting seat has at least one second rib, the opening is shaped to allow the second rib slides over the first rib along a first rotation direction but prohibit the second rib rotates along a second rotation direction.

In one embodiment, the support mechanism has a supporting member extending upward for supporting a bottom of the reticle and a mounting member opposite to the supporting member.

In one embodiment, the lower-cover mounting seat has an opening defined therethrough, the opening has a first channel that allows the mounting member of the support mechanism enters therein or departs therefrom, and the opening has a second channel that allows the mounting member of the support mechanism rotates relatively to the opening.

In one embodiment, the supporting member has a first inclined surface, a second inclined surface and a third inclined surface, the first inclined surface and the second inclined surface are configured to contact with the reticle while the third inclined surface is sandwiched between the first inclined surface and the second inclined surface for exhausting particles fell from the first and second inclined surfaces.

In one embodiment, the third inclined surface has multiple inclined surfaces.

The present invention yet provides a reticle pod including an upper cover having an abutting surface and a plurality of upper-cover mounting seats located on the abutting surface; a lower cover having a carrying surface and a plurality of lower-cover mounting seats located on the carrying surface; at least one first support mechanism having a supporting member extending upward for supporting a reticle or a reticle carrier and a mounting member opposite to the supporting member, wherein the mounting member is configured to detachably connect to the corresponding lower-cover mounting seat such that the first support mechanism is optionally loaded to the lower cover, wherein the mounting member is configured to connect to the corresponding lower-cover mounting seat by male-female connection; and at least one second support mechanism having an abutting portion for abutting a top of the reticle and a joint portion connecting with the abutting portion, wherein the joint portion is configured to detachably connect to the corresponding upper-cover mounting seat such that the second support mechanism is optionally loaded to the upper cover, wherein the joint portion is configured to connect to the upper-cover mounting seat by male-female connection.

In one embodiment, the upper-cover mounting seat has multiple protruding wing portions, the joint portion of the second support mechanism has an opening defined therethrough, the opening has a first channel that allows the protruding wing portions enter therein or depart therefrom, and the opening has a second channel that allows the protruding wing portions rotate relatively to the opening.

In one embodiment, said male-female connection between the mounting member of the first support mechanism and the lower-cover mounting seat prevents the first support mechanism from rotating relatively to the lower-cover mounting seat.

In one embodiment, the first support mechanism has a lateral extension portion, a first inclined arm and a second inclined arm, wherein the first inclined arm and the second inclined arm are configured to support the reticle or the reticle carrier.

The present invention provides still another reticle pod including an upper cover having an abutting surface and a plurality of upper-cover mounting seats located on the abutting surface; and a support mechanism having an abutting portion for abutting a top of a reticle or a reticle carrier and a joint portion connecting with the abutting portion, wherein the joint portion is configured to detachably connect to the corresponding upper-cover mounting seat such that the support mechanism is optionally loaded to the upper cover.

In one embodiment, the upper-cover seat has multiple protruding wing portions that couple to the corresponding joint portion.

In one embodiment, the joint portion of the support mechanism has an opening defined therethrough, the opening has a first channel that allows the upper-cover mounting seat enters therein or departs therefrom, the opening has a second channel that allows the upper-cover mounting seat rotates relatively to the opening.

In one embodiment, the opening has at least one first rib, the upper-cover mounting seat has at least one second rib, the opening is shaped to allow the second rib slides over the first rib along a first rotation direction but prohibit the second rib rotates along a second rotation direction.

BRIEF DESCRIPTION OF THE DRAWINGS

For the actual embodiments of the present invention, the scale of the elements shown in the drawings should not be interpreted in a restrictive sense.

DETAILED DESCRIPTION OF THE PREFERRED EMBODIMENTS

Figure 1:
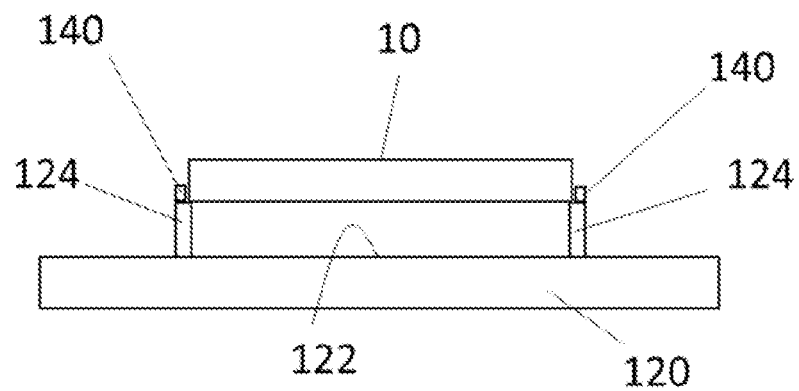
FIG. 1 is a schematic view showing the relationship between a reticle pod (with the upper cover removed) and a reticle according to the present disclosure.

The present invention provides a reticle pod, and more particularly to a reticle pod with a quick-release mechanism. The accompanying drawings, which are incorporated herein, illustrate in details the embodiments of the present invention. In these accompanying drawings, identical and/or equivalent elements are marked with the same reference numbers.

Various embodiments of the present invention are disclosed herein. Nevertheless, it is essential to know that the disclosed embodiments are used as examples to demonstrate the various forms of the invention. Each drawing provided with respect to the specific embodiment is intended as an example only, not as a limitation. In addition, the drawings are not necessarily proportional to the actual scale, and some features may be enlarged to emphasize details of a particular element (all the scales, materials, and the like shown in the drawings are merely provided as examples, not as limitations). Therefore, details of specific structures and functions disclosed herein shall not be construed as a limitation. Rather, they are merely used as a basis for teaching a person ordinarily skilled in the art how to practice the embodiments of the present invention disclosed herein.

FIG. 1 is a schematic view showing a reticle pod 100 and a reticle 10 according to the present disclosure; in particular, the drawing shows a view where the reticle 10 is accommodated within the reticle pod 100 (the upper cover is not shown). The reticle pod 100 comprises a lower cover 120 and a plurality of support mechanisms 140, which are connected to the lower cover 120 by a detachable means. Detailed descriptions of the embodiments are provided hereinafter. In particular, the lower cover 120 comprises a carrying surface 122 and a plurality of mounting seats 124, which are used to connect to the support mechanisms 140 and are distributed on the carrying surface. The mounting seats 124 and the support mechanisms 140 together lift the reticle 10 above the carrying surface 122.

Figure 2:
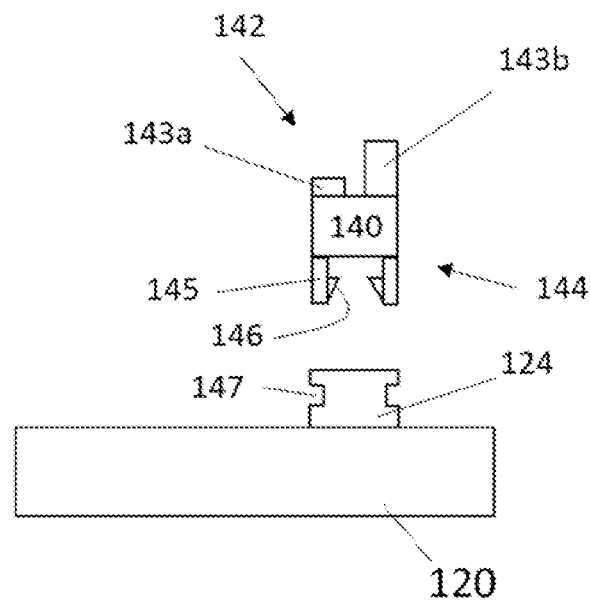
FIG. 2 is a partially enlarged schematic view showing a support mechanism of the reticle pod according to an embodiment of the present disclosure.

FIG. 2 is a partially enlarged schematic view showing one support mechanism 140 of the reticle pod 100 according to an embodiment of the present disclosure. The support mechanism 140 comprises a supporting member 142 extending upward for supporting the reticle 10, and a mounting member 144 opposite the supporting member 142 to face the lower cover 120, wherein the mounting member 144 is detachably connected with the corresponding mounting seat 124, so that the support mechanism 140 can be selectively installed on the lower cover 120. In the embodiment, the mounting member 144 comprises two flexible legs 145, and each flexible leg 145 has a holding member 146 at the end. The mounting seat 124 comprises two notches 147 configured to receive and stably accommodate the holding members 146 of the flexible legs 145. For example, the mounting seat 124 may be provided with sliding grooves, which enable the holding members 146 of the flexible legs 145 of the support mechanism 140 to slide into the corresponding notches 147 along the surfaces of the mounting seat 124. The support mechanism 140 may be provided with a pressing mechanism, which may be operated to release the holding members 146 of the flexible legs 145 from the corresponding notches 147, and the holding members 146 may be hook-shaped or have other configurations.

Figure 3:
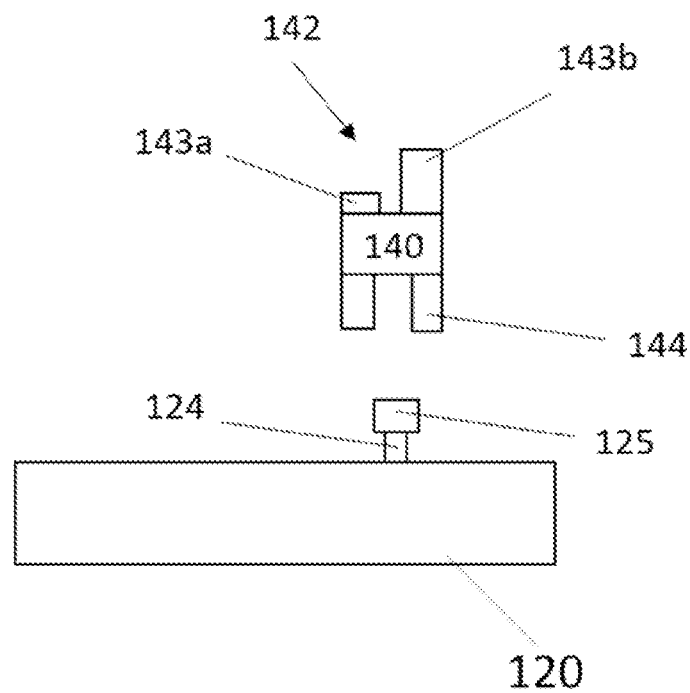
FIG. 3 is a partially enlarged schematic view showing a support mechanism of the reticle pod according to another embodiment of the present disclosure.

FIG. 3 is a partially enlarged schematic view showing the support mechanism 140 of the reticle pod 100 according to another embodiment of the present disclosure. The support mechanism 140 comprises a supporting member 142 extending upward for supporting the reticle 10 and a mounting member 144 opposite the supporting member 142 to face the lower cover 120, wherein the mounting member 144 is detachably connected with the corresponding mounting seat 124, so that the support mechanism 140 can be selectively installed on the lower cover 120. The mounting member 144 is configured to be connected with the mounting seat 124 in a lockable manner; the mounting seat 124 is a securing post extending upward from the carrying surface 122 and comprises a cap portion 125 on the top. The mounting member 144 of the support mechanism 140 and the cap portion 125 can be connected by a proper fit. For example, the mounting member 144 and the cap portion 125 can have mating structural forms, so that the mounting member 144 can fit to the cap portion 125 and be prevented from rotation due to the mating structure. Alternatively, the mounting member 144 can be connected with the cap portion 125 by friction.

In another embodiment, the mounting member 144 can be configured with a thread, whereas the corresponding mounting post 124 or the cap portion 125 has another thread that can mate with the one on the mounting member 144.

Figure 4:
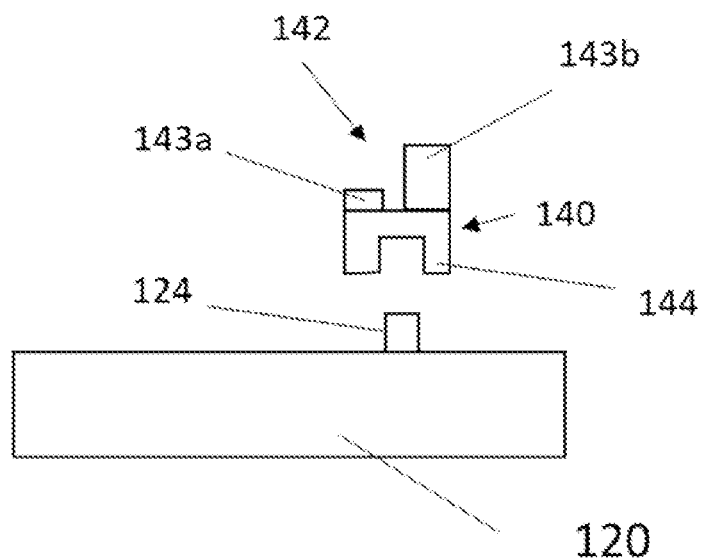
FIG. 4 is a partially enlarged schematic view showing a support mechanism of the reticle pod according to yet another embodiment of the present disclosure.

FIG. 4 is a partially enlarged schematic view showing the support mechanism 140 of the reticle pod 100 according to yet another embodiment of the present disclosure. Likewise, the support mechanism 140 comprises a supporting member 142 extending upward for supporting the reticle 10 and a mounting member 144 opposite the supporting member 142, wherein the mounting member 144 is detachably connected with the corresponding mounting seat 124, so that the support mechanism 140 can be selectively installed on the lower cover 120. The mounting member 144 and the securing seat 124 are configured to form a mating connection, wherein the mounting member 144 is a female connector, and the mounting seat 124 is a male connector, and vice versa. Similar to the embodiment shown in FIG. 3, the female connector and the male connector can have mating structural forms, so as to prevent rotation of the mounting member 144 relative to the mounting seat 124.

Please see FIGS. 2-4. In one embodiment, the supporting member 142 further comprises at least one first supporting post 143a for contacting the bottom surface of the reticle 10 and at least one second supporting post 143b for preventing displacement of the side part of the reticle 10. However, there is no restriction on the number of supporting posts in the present invention.

Figure 5:
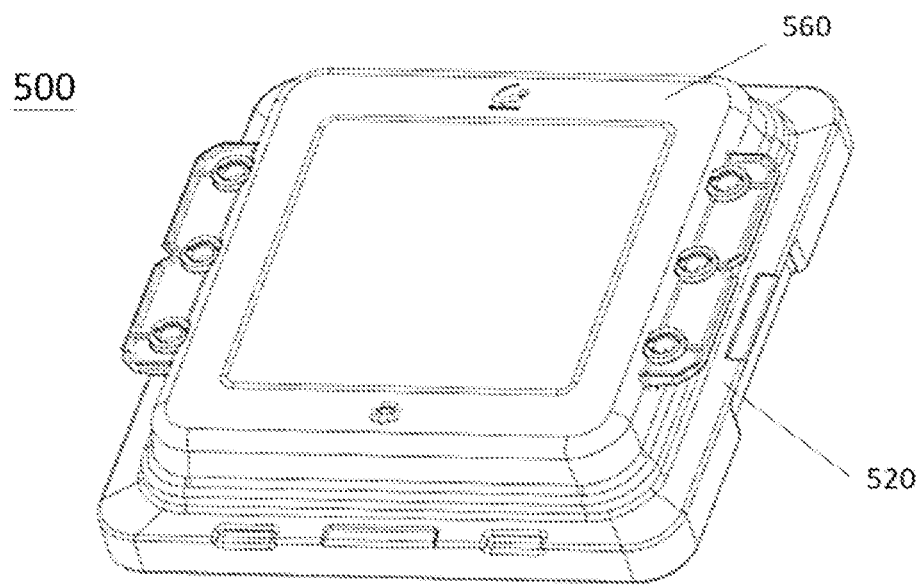
FIG. 5 is a perspective view showing the appearance of a reticle pod according to an embodiment of the present disclosure.
Figure 6A:
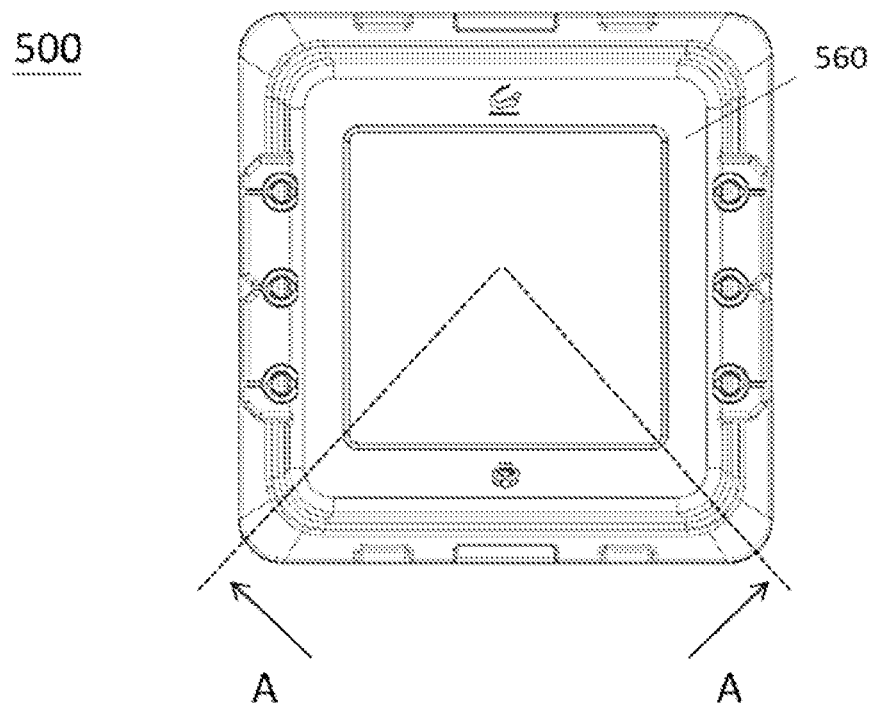
FIG. 6A is a top view showing the appearance of the reticle pod according to an embodiment of the present disclosure.
Figure 6B:
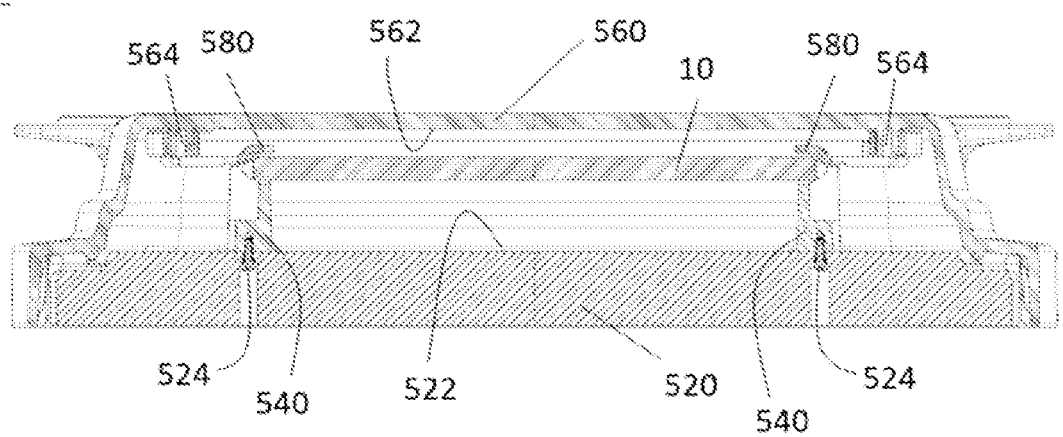
FIG. 6B is a cross-sectional view along line AA of FIG. 6A.

FIG. 5 is a perspective view showing the appearance of a reticle pod 500 according to an embodiment. The reticle pod 500 can be an outer reticle pod for accommodating an inner reticle pod or a reticle carrier. FIG. 6A is a top view of the reticle pod 500; FIG. 6B is a cross-sectional view of the reticle pod 500 along line AA of FIG. 6A. FIGS. 5, 6A, and 6B demonstrate the relationship between the reticle pod 500 and the reticle 10. The reticle 10 is accommodated in the reticle pod 500, which comprises a lower cover 520, lower-cover support mechanisms 540, an upper cover 560, and upper-cover support mechanisms 580. The upper cover 560 and the lower cover 520 define an accommodating space within the reticle pod 500. Alternatively, besides accommodating the reticle 10, the reticle pod 500 can also accommodate an inner reticle pod or other types of carriers (e.g., a pellicle-packaging container). The lower cover 520 comprises a carrying surface 522 and a plurality of lower-cover mounting seats 524 distributed on the carrying surface 522. Each lower-cover mechanism 540 is connected with the lower-cover mounting seat 524 on the lower cover 520 by a detachable means. The lower-cover support mechanisms 540 are used to support the bottom of the reticle 10. The upper cover 560 comprises an abutting surface 562 and a plurality of upper-cover mounting seats 564 distributed on the abutting surface 562. Each upper-cover support mechanism 580 is connected with the upper-cover mounting seat 564 on the upper cover 560 by a detachable means. The upper-cover support mechanisms 580 are used to abut against the top of the reticle 10.

Figure 7:
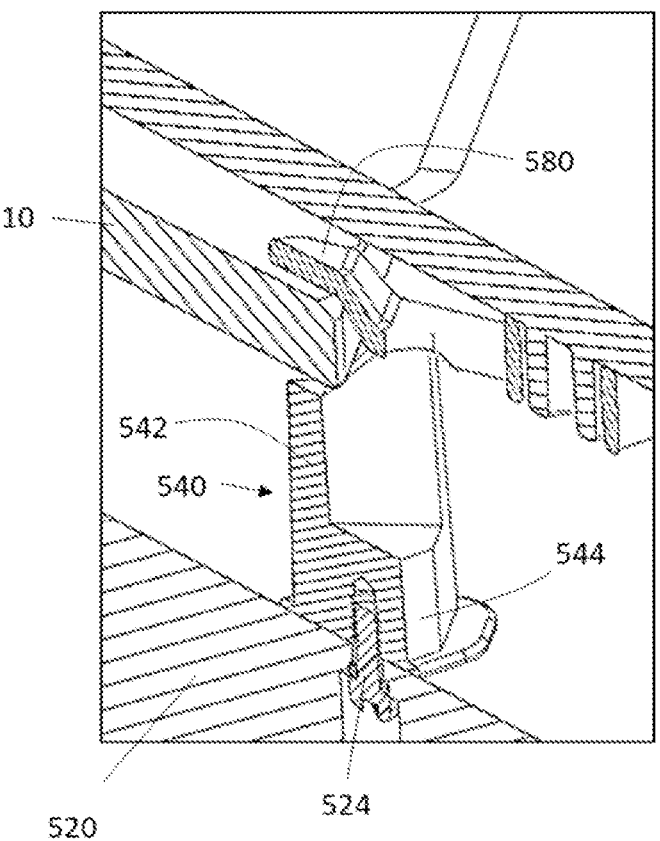
FIG. 7 is a partially enlarged cross-sectional view of the support mechanism of the reticle pod illustrated in FIG. 6B.

FIG. 7 shows another perspective of the cross-sectional view of the reticle pod 500 illustrated in FIG. 6B. It is seen that the reticle 10 accommodated in the reticle pod 500 is confined between the lower-cover support mechanism 540 and the upper-cover support mechanism 580. The lower-cover support mechanism 540 comprises a supporting portion 542 extending upward for supporting the reticle 10 and a mounting member 544 that is opposite the supporting portion 542 and faces the lower cover 520. The mounting member 544 is detachably connected with the corresponding mounting seat 524, so that the lower-cover support mechanism 540 can be selectively installed on the lower cover 520. In this embodiment, the mounting member 544 is connected with the mounting seat 524 in a lockable manner; the mounting member 544 may be further configured with a thread, whereas the corresponding mounting seat 524 may have another thread that can mate with the one on the mounting member 544.

Figure 8:
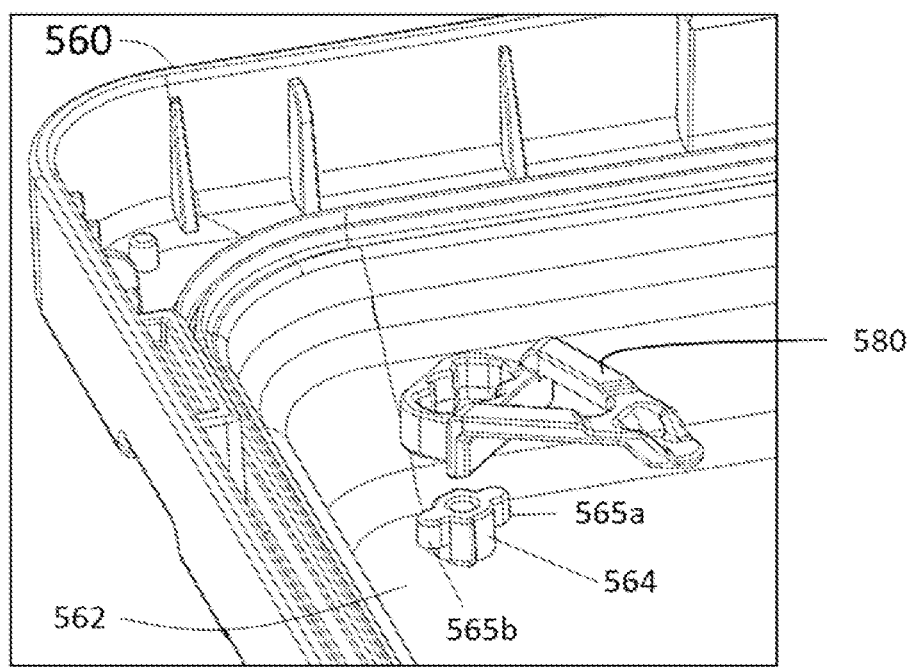
FIG. 8 shows an upper-cover support mechanism of the reticle pod being separated from an upper-cover securing seat.

FIG. 8 shows the upper-cover support mechanism 580 being separated from the upper-cover mounting seat 564. The upper cover 560 comprises an abutting surface 562 and a plurality of upper-cover mounting seats 564 distributed on the abutting surface 562. The abutting surface 562 is a downward-facing surface on the inside of the upper cover 560, and this downward-facing surface is not in contact with the lower cover 520. Each of the upper-cover mounting seat 564 is a structure extending downward from the abutting surface 562. In this embodiment, the upper-cover mounting seat 564 comprises a cylinder portion and two protruding wing portions 565a and 565b that extend laterally from the cylinder portion. In other possible embodiments, the upper-cover mounting seats 564 may be arranged on the side surface on the inside of the upper cover 560. Each upper-cover support mechanism 580 is connected to the upper-cover mounting seat 564 on the upper cover 560 by a detachable means, and the connection method is provided hereinafter.

Figure 9A:
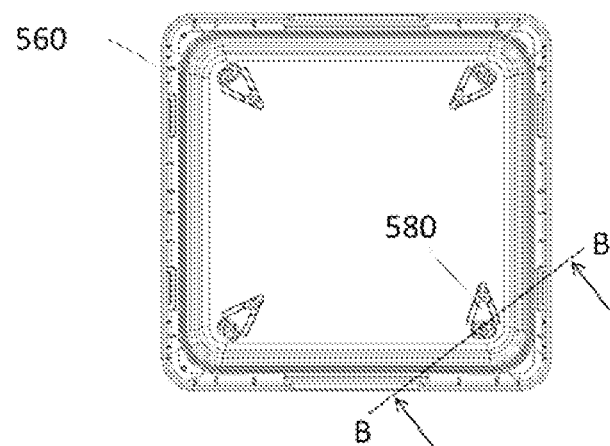
FIG. 9A is a bottom view of an upper cover of the reticle pod in a first state.
Figure 9B:
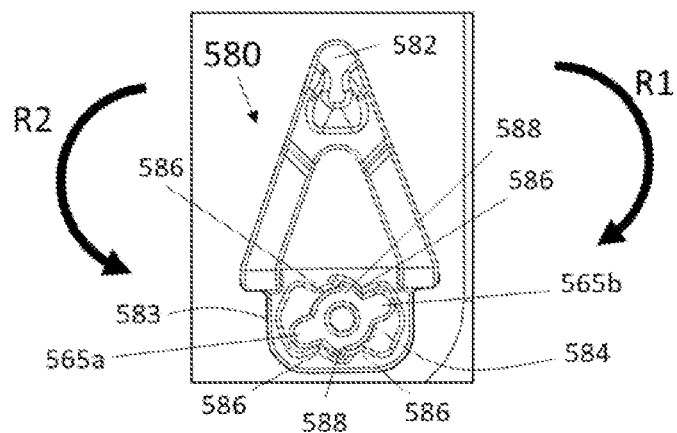
FIG. 9B is an enlarged view of one of the upper-cover support mechanisms shown in FIG. 9A.
Figure 9C:
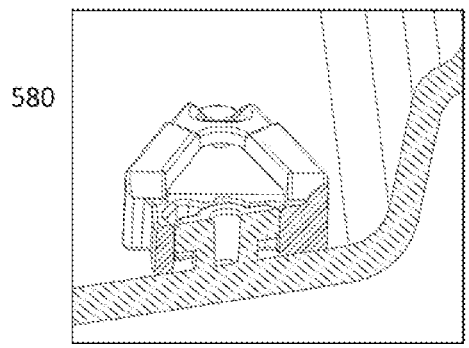
FIG. 9C is a partial cross-sectional view of an upper-cover support mechanism along line BB illustrated in FIG. 9A.
Figure 10A:
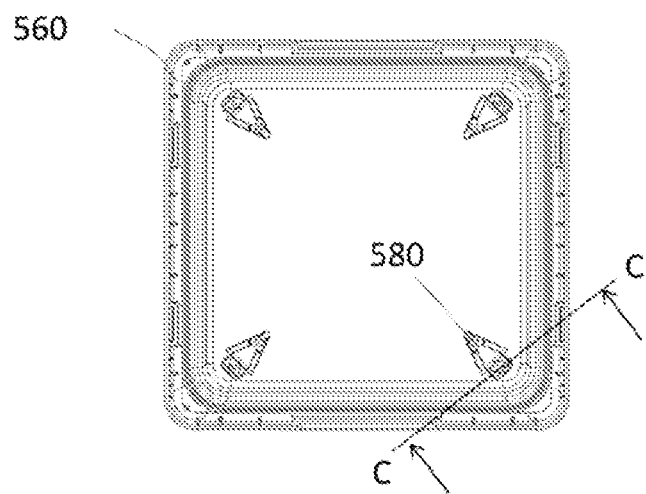
FIG. 10A is a bottom view of the upper cover of the reticle pod in a second state.
Figure 10B:
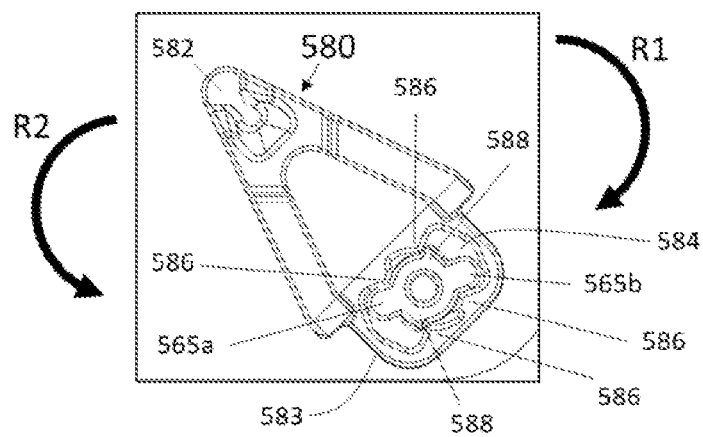
FIG. 10B is an enlarged bottom view of one of the upper-cover support mechanisms shown in FIG. 10A.
Figure 10C:
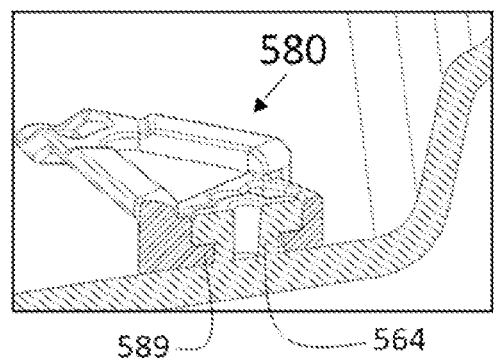
FIG. 10C is a partial cross-sectional view of the upper-cover support mechanism along line CC illustrated in FIG. 10A.

FIG. 9A is a bottom view of the upper cover 560 of the reticle pod 500 in a first state. FIG. 9B shows the first state when one of the upper-cover support mechanisms 580 of FIG. 9A is connected with one upper-cover mounting seat 564; in the first state, the upper-cover support mechanism 580 can be pulled out and separated from the mounting seat 564. FIG. 9C is a cross-sectional view of the upper-cover support mechanism 580 along line BB illustrated in FIG. 9A. FIG. 10A is a bottom view of the upper cover 560 of the reticle pod 500 in a second state. FIG. 10B shows the second state when one of the upper-cover support mechanisms 580 of FIG. 10A is connected with one upper-cover mounting seat 564; in the second state, the upper-cover support mechanism 580 cannot be pulled out and separated from the mounting seat 564. FIG. 10C is a cross-sectional view of the upper-cover support mechanism 580 along line CC illustrated in FIG. 10A.

To be specific, FIGS. 9A to 9C demonstrate that the upper-cover support mechanism 580 is connected with the upper-cover mounting seat 564, while the upper-cover support mechanism 580 is in a first orientation relative to the upper-cover mounting seat 564. FIGS. 10A to 10C demonstrate that the upper-cover support mechanism 580 is pivoted to be in a second orientation relative to the upper-cover mounting seat 564, and the second orientation causes the upper-cover support mechanism 580 to be firmly fastened and therefore inseparable from the upper cover 560.

As shown in FIGS. 9B and 10B, the upper-cover support mechanism 580 comprises an abutting portion 582 to abut against the top of the reticle, and a joint portion 583 that connects to the abutting portion 582. The abutting portion 582 is like a triangle in shape, with its width narrowing gradually from the joint portion 583 to the distal end. Further, the abutting portion 582 has a bendable structure near the distal end; the bendable structure is configured to properly contact the top rim of the reticle or the upper surface nearby when the upper cover 560 and lower cover 520 are coupled, as shown in FIG. 7, but the structure or configuration of the abutting portion 582 is not limited to what is shown in the illustrated embodiment. The joint portion 583 of the upper-cover support mechanism 580 comprises an opening 584, which is used to accommodate the upper-cover mounting seat 564 and allows the upper-cover mounting seat 564 to pivot within it. The opening 584 has a butterfly-like shape and provides a space for the wing portions 565a and 565b to pivot. The joint portion 583 comprises a plurality of first ribs 586 on the inner side which face the opening 584, and the upper-cover mounting seat 564 comprises second ribs 588 on the surface of the cylinder portion. As shown in the drawings, the four first ribs 586 are basically in contact with the surface on the cylinder portion of the upper-cover mounting seat 564. The shape of the opening is configured to allow the second ribs 588 of the upper-cover mounting seat 564 to slide past the first ribs 586 in a first rotational direction R1 (clockwise in the drawings), i.e., from the state of FIG. 9B to the state of FIG. 10B, but to prohibit the second ribs 588 in FIG. 9B from rotating in the second rotational direction R2 (counterclockwise). As shown in FIG. 9B, there is a structure formed between two adjacent first ribs 586 to prevent the upper-cover mounting seat 564 from rotating in the R2 direction. To reverse the state of FIG. 10B back to the state of FIG. 9B, a greater force may be applied to cause the second ribs 588 to snap past the first ribs 586, so that the upper-cover support mechanism 580 is back to a state where it can be pulled out. It should be understood that the first rotational direction R1 and the second rotational direction R2 are used to express the relative directions of the upper-cover support mechanism 580 and the upper-cover securing seat 584; in practice, it is the upper-cover support mechanism 580 that is being rotated. To change from the state of FIG. 9B to the state of FIG. 10B, an appropriate force can be applied to the upper-cover support mechanism 580, so that the first ribs 586 can snap past the second ribs 588 to complete the installation of the upper-cover support mechanism 580. On the contrary, to reverse from the state of FIG. 10B back to the state of FIG. 9B, a greater force in the opposite direction is applied to the upper-cover support mechanism 580 to cause the first ribs 586 to snap past the second ribs 588, so that the upper-cover support mechanism 580 is back to a state where it can be detached.

To be specific, the opening 584 has a first passage that allows the upper-cover mounting seat 564 to enter or leave, and a second passage that allows the upper-cover mounting seat 564 to rotate relative to the opening 584. As shown in FIG. 9C, the opening 584 is configured to allow the upper-cover mounting seat 564 to enter and leave the opening 584 through the first passage when the upper-cover support mechanism 580 is in a first orientation. As shown in FIG. 10C, the opening 584 is configured such that when the upper-cover support mechanism 580 is in a second orientation, the upper-cover mounting seat 564 is restricted in the opening 584 by a stopper 589 through the second passage. That is, the stopper 589 contacts and restricts the wing portions 565a and 565b of the upper-cover mounting seat 564, so that the upper-cover support mechanism 580 cannot be pulled up.

Figure 11:
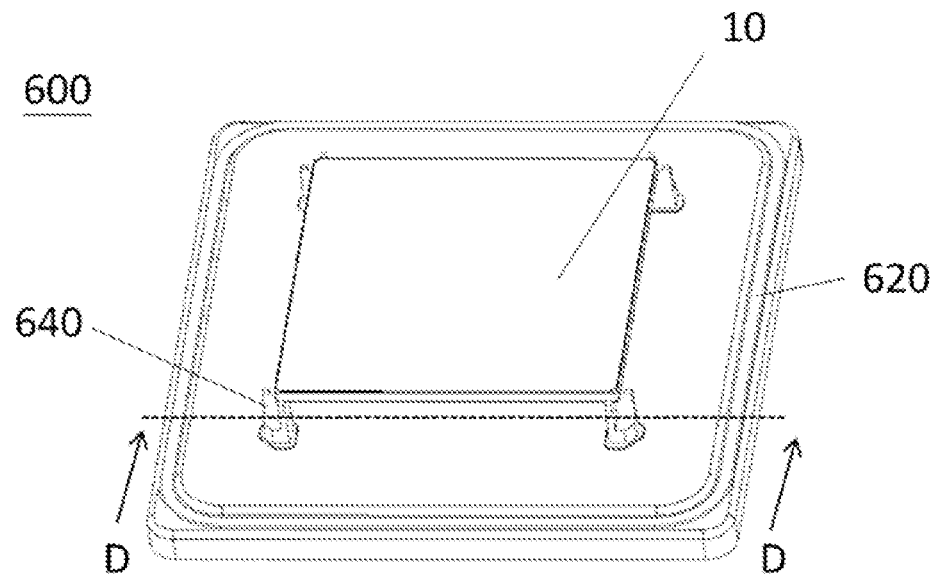
FIG. 11 is a perspective view showing a reticle pod (with the upper cover removed) and a reticle according to another embodiment of the present disclosure.
Figure 12A:
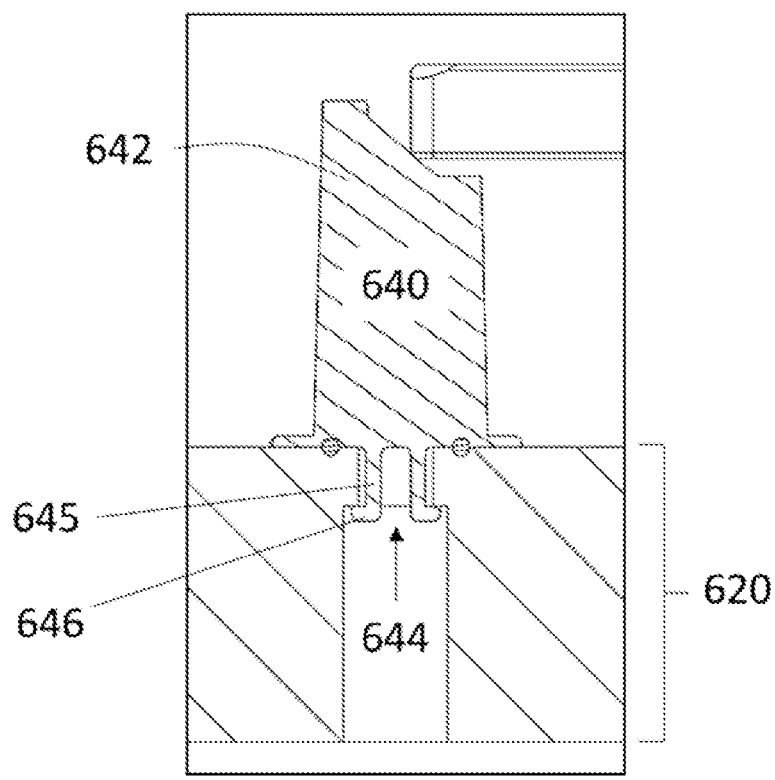
FIG. 12A is a cross-sectional views of a support mechanism according to an embodiment of the present disclosure, along line DD illustrated in FIG. 11.
Figure 12B:
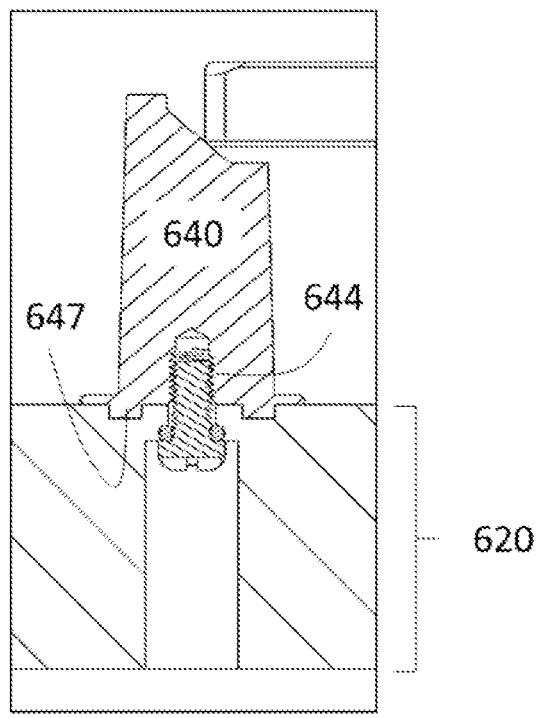
FIG. 12B is a cross-sectional views of a support mechanism according to another embodiment of the present disclosure, along line DD illustrated in FIG. 11.
Figure 12C:
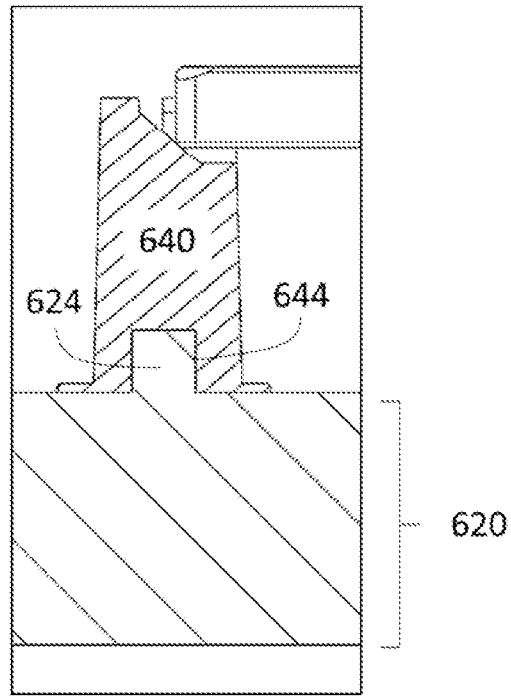
FIG. 12C is a cross-sectional views of a support mechanism according to yet another embodiment of the present disclosure, along line DD illustrated in FIG. 11.

FIG. 11 shows a reticle pod 600 (with the upper cover removed) and a reticle 10 according to another embodiment of the present disclosure. FIGS. 12A-12C are cross-sectional views of a support mechanism along line DD illustrated in FIG. 11, showing different embodiments of the support mechanism respectively. FIG. 11 shows the relationship between the reticle pod 600 and the reticle 10. The reticle 10 is supported and accommodated in the reticle pod 600 (as shown in FIG. 7). The reticle pod 600 comprises a lower cover 620 and a plurality of lower-cover support mechanisms 640.

As shown in the embodiment in FIG. 12A, each lower-cover support mechanism 640 comprises a supporting member 642 extending upward for supporting the reticle 10, and a mounting member 644 opposite the supporting member 642 and facing the lower cover 620. The mounting member 644 is detachably connected with a corresponding securing portion (a hole in this embodiment) of the lower cover 620, so that the lower-cover support mechanism 640 can be selectively installed on the lower cover 620. In this embodiment, the mounting member 644 has two flexible legs 645, and each flexible leg 645 has a holding member 646 at the end. The securing portion (hole) of the lower cover 620 is configured to receive and stably accommodate the holding member 646 of the flexible leg 645. For example, the lower cover 620 may be provided with sliding grooves (not shown) for the holding members 646 of the flexible legs 645 of the lower-cover support mechanism 640 to enter the hole along the sliding grooves; thus, the holding members 646 can abut against a shoulder portion of the hole, so that the lower-cover support mechanism 640 can be secured to the lower cover 640. A sealing means (such as an airtight sealing ring) may be provided between the supporting member 642 and the mounting member 644 of the lower-cover support mechanism 640 to prevent the accommodating space of the reticle pod from communicating with the space outside the cover via the hole. Moreover, the lower-cover support mechanism 640 may be provided with a pressing mechanism, which can be operated to release the holding members 646 of the flexible legs 645 from the corresponding grooves. Alternatively, a tool may be used to release the flexible legs 645 via the hole of the lower cover 620; also, the holding members 646 may be hook-shaped or have other configurations.

As shown in the embodiment in FIG. 12B, the mounting member 644 (a hole in this embodiment) of the lower-cover support mechanism 640 is detachably connected with a screw provided on the lower cover 620, so that the lower-cover support mechanism 640 can be selectively installed on the lower cover 620. The mounting member 644 can be a threaded hole for fitting the screw, so that the lower-cover support mechanism 640 can be fastened to the lower cover 620. The mounting member 644 may be provided with a positioning structure 647 at the end; the positioning structure 647 can be used to align the lower-cover support mechanism 640 with the installation position before the screw is provided on the lower cover 620.

As shown in the embodiment in FIG. 12C, the mounting member 644 of the lower-cover support mechanism 640 is a hole; the mounting member 644 fits a corresponding mounting seat 624 from above, so that the lower-cover support mechanism 640 can be selectively installed on the lower cover 620. A mating connection can thus be formed, with the mounting member 644 being a female connector and the mounting seat 624 being a male connector, and vice versa. The mounting member 644 and the mounting seat 624 can have mating structural forms; in particular, such structural forms can include certain angles to prevent the mounting member 644 from rotating relative to the mounting seat 624.

Figure 13A:
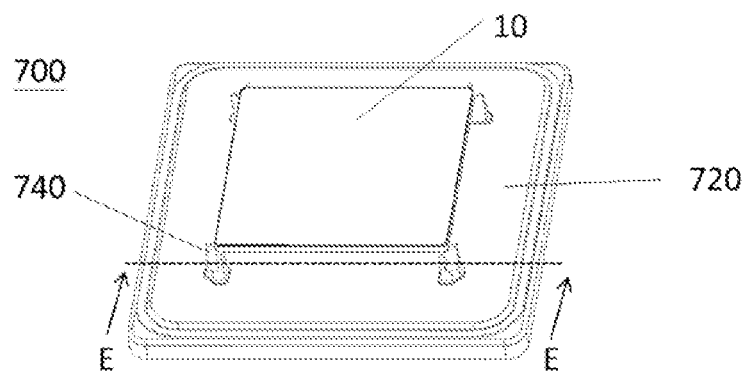
FIG. 13A is a perspective view showing a reticle pod (with the upper cover removed) and a reticle according to yet another embodiment of the present disclosure.
Figure 13B:
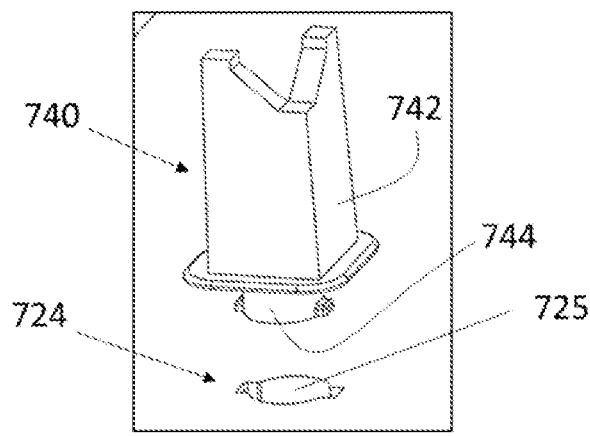
FIG. 13B is a perspective view showing a support mechanism (before the assembling step) illustrated in FIG. 13A.
Figure 13C:
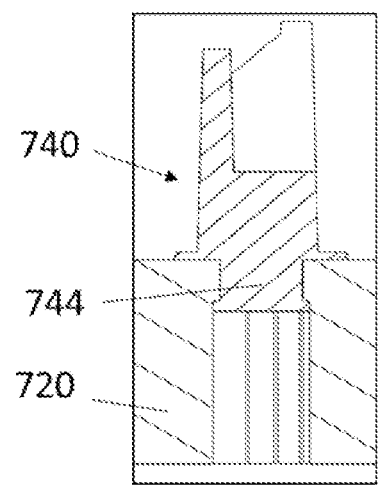
FIG. 13C is a cross-sectional view of the support mechanism along line EE illustrated in FIG. 13A.

FIG. 13A shows a reticle pod 700 (with the upper cover removed) and a reticle 10 according to yet another embodiment of the present disclosure. FIG. 13B shows a lower-cover support mechanism 740 and a lower-cover securing seat (a hole) of a lower cover 720. FIG. 13C is a cross-sectional view of one lower-cover support mechanism 740 along line EE illustrated in FIG. 13A. Each lower-cover support mechanism 740 comprises a supporting portion 742 extending upward for supporting the reticle 10, and a securing portion 744 opposite the supporting portion 742 and facing the lower cover 720. The securing portion 744 is detachably connected with a corresponding lower-cover securing seat 724, so that the lower-cover support mechanism 740 can be selectively installed on the lower cover 720. The securing portion 744 basically comprises a cylinder portion and two wing portions extending from the surface of the cylinder portion. As shown in FIG. 13B, the lower-cover securing seat 724 has an opening 725 having a shape that mates with the shape of the securing portion 744, thereby allowing the securing portion 744 of the lower-cover support mechanism 740 to enter or leave through the opening 725. Similar to the structure depicted in FIG. 9, the opening 725 is also configured to include a first passage that allows the securing portion 744 to enter or leave, and a second passage that allows the securing portion 744 to rotate relative to the opening 725. The process of mounting the lower-cover support mechanism 740 to the lower-cover securing seat 724 of the lower cover 720 is described as follows.

Figure 14A:
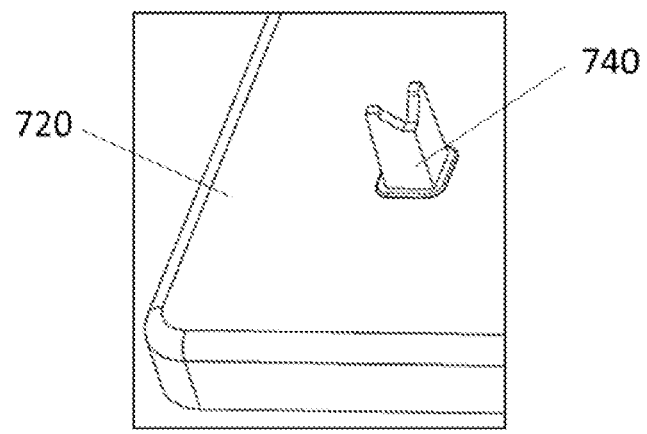
FIGS. 14A to 14C show the process of installing the lower-cover support mechanism on the securing seat of the lower cover.
Figure 14B:
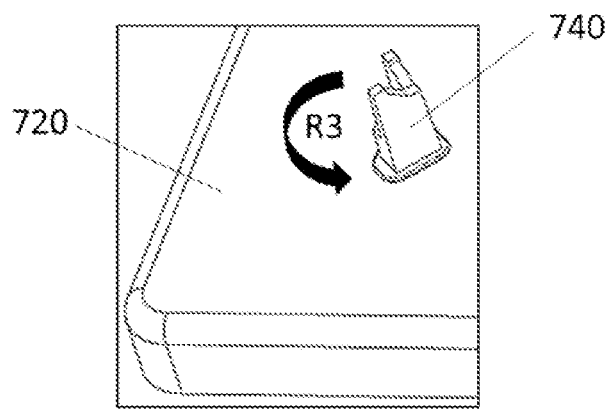
Figure 14C:
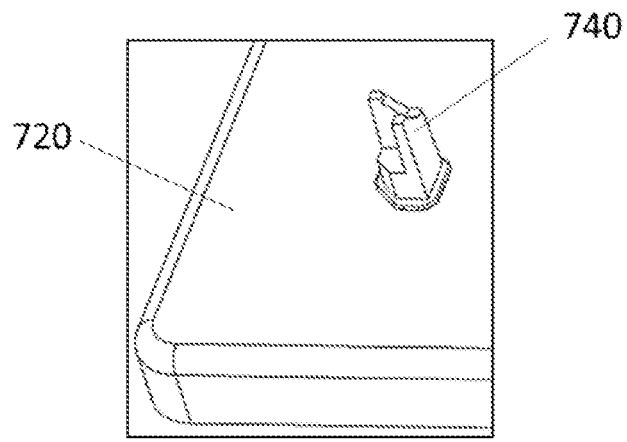

FIGS. 14A to 14C show the process of installing the lower-cover support mechanism 740 on the lower cover 720. First, as FIG. 14A shows, the lower-cover support mechanism 740 is inserted into the opening 725 in the orientation as illustrated in FIG. 13B. Next, as FIG. 14B shows, the lower-cover support mechanism 740 is rotated in a direction R3. Finally, the lower-cover support mechanism 740 maintains in the orientation as shown in FIG. 14C and cannot be pulled up.

Figure 14D:
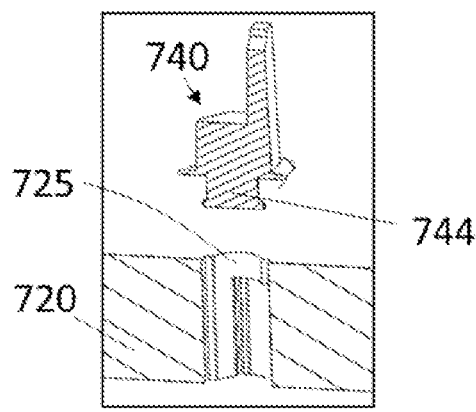
FIGS. 14D to 14F show the process of installing the lower-cover support mechanism on the securing seat of the lower cover in cross-sectional views.
Figure 14E:
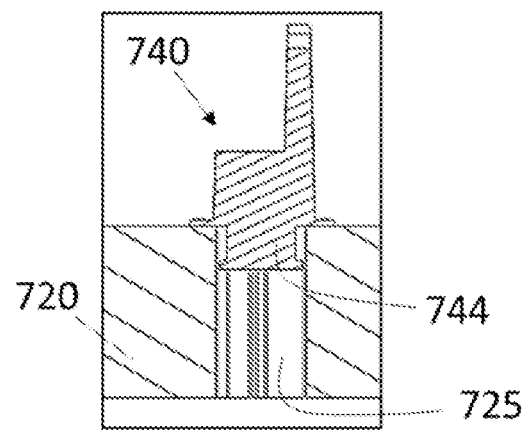
Figure 14F:
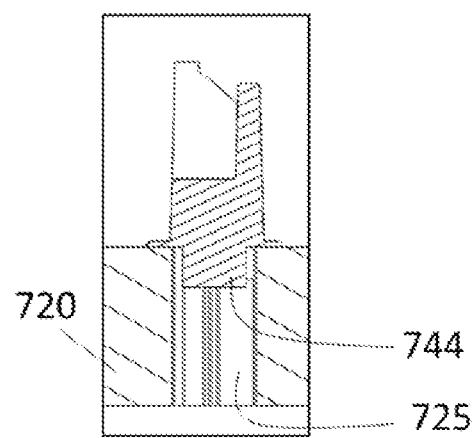

FIGS. 14D to 14F show the process of installing the lower-cover support mechanism 740 on the lower cover 720 in cross-sectional views. FIG. 14D shows that the lower-cover support mechanism 740, which is in a first orientation, can be aligned with the opening 725; FIG. 14E shows the lower-cover support mechanism 740 after it is inserted into the opening 725. FIG. 14F shows that the lower-cover support mechanism 740 is in a second orientation after being rotated, and a stopper (not shown) at the opening 725 contacts and restricts the wing portions of the lower-cover support mechanism 740, so that the lower-cover support mechanism 740 cannot be pulled up.

Figure 15A:
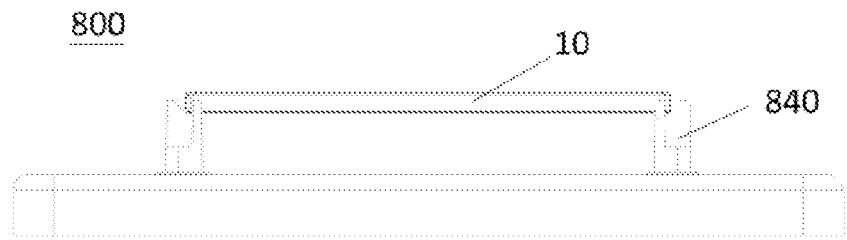
FIG. 15A is a front view showing a reticle pod (with the upper cover removed) and a reticle according to still another embodiment of the present disclosure.
Figure 15B:
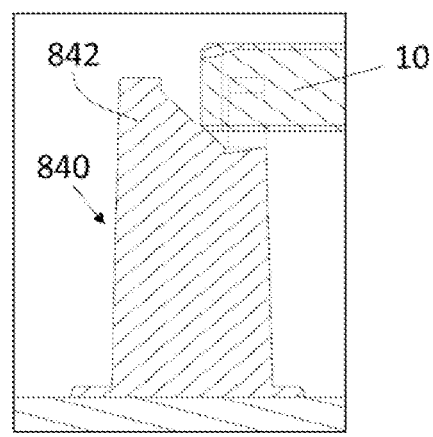
FIG. 15B is a partially enlarged cross-sectional view showing the contact between the reticle and one lower-cover support mechanism illustrated in FIG. 15A.
Figure 15C:
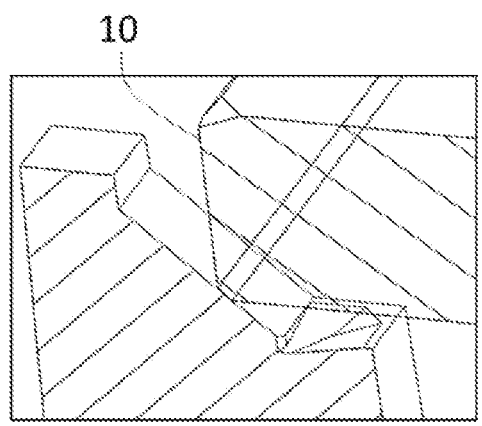
FIG. 15C is a cross-sectional view showing the lower-cover support mechanism and the reticle from another perspective.
Figure 15D:
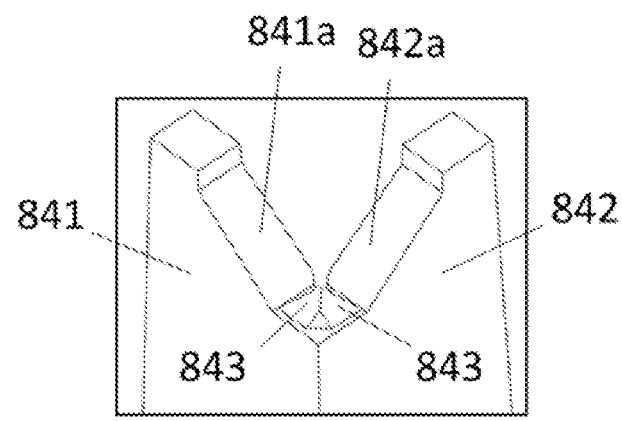
FIG. 15D is a partial perspective view of the lower-cover support mechanism.

FIG. 15A is a front view showing a reticle pod 800 (with the upper cover removed) and a reticle 10. FIG. 15B is a cross-sectional view showing the reticle 10 and one lower-cover support mechanism 840. FIG. 15C is a partially enlarged cross-sectional view showing the lower-cover support mechanism 840 and the reticle 10. FIG. 15D shows an embodiment of the supporting portion 842 of the lower-cover support mechanism 840. The securing portion of the lower-cover support mechanism 840 can be in any form as described in the previous embodiments.

Please see FIG. 15D. The lower-cover support mechanism 840 has a first wall 841 and a second wall 842 extending upward from its bottom. The top ends (i.e., the supporting portion) of the first wall 841 and the second wall 842 are provided with a first inclined surface 841a and a second inclined surface 842a, respectively; the two inclined surfaces are inclined downward from the top ends toward the intersection of the first wall 841 and the second wall 842. When the reticle 10 is placed on the lower-cover support mechanisms 840, the lower edge of the reticle 10 will contact the first inclined surface 841a and the second inclined surface 842a of each lower-cover support mechanisms 840. This design allows the reticle 10 to be placed correctly after gradually sliding down along the first inclined surfaces 841a and the second inclined surfaces 842a. Furthermore, a dust collecting mechanism, which is defined by one or more third inclined surfaces 843, is provided at the intersection of the first inclined surface 841a and the second inclined surface 842a. In the illustrated embodiment, there are two third inclined surfaces 843. As shown in FIGS. 15B to 15D, the two third inclined surfaces 843 are inclined toward the same direction (for example, toward a direction away from the reticle), so that dust or fine particles generated by the friction between the lower edge of the reticle 10 and the first and second inclined surfaces 841a, 842a can fall on the third inclined surfaces 843 and then slide down to the lower cover in a direction away from the reticle 10 to avoid contamination of the bottom surface of the reticle 10.

Figure 16A:
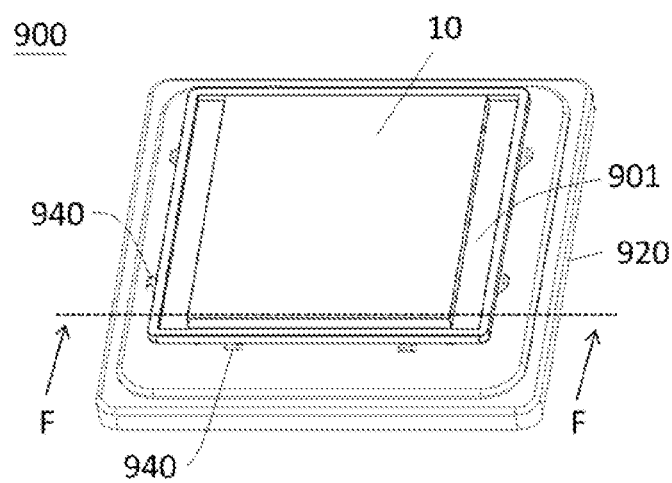
FIG. 16A is a perspective view showing a reticle pod (with the upper cover removed) and a reticle carrier according to still another embodiment of the present disclosure.
Figure 16B:
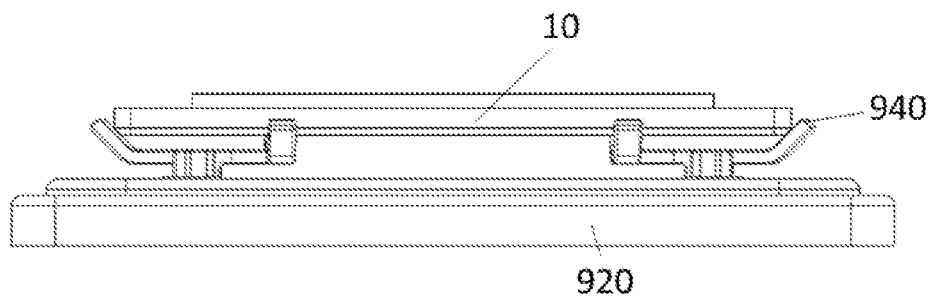
FIG. 16B is a front view showing the embodiment illustrated in FIG. 16A.
Figure 16C:
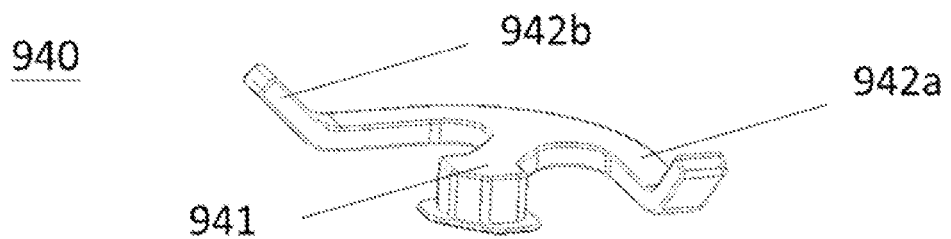
FIG. 16C is a perspective view showing a lower-cover support mechanism of the reticle pod.
Figure 16D:
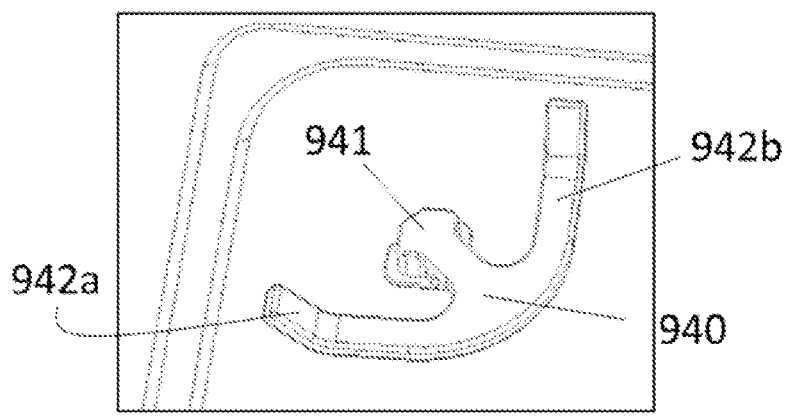
FIG. 16D is a perspective view showing the lower cover and the lower-cover support mechanism of the reticle pod.
Figure 16E:
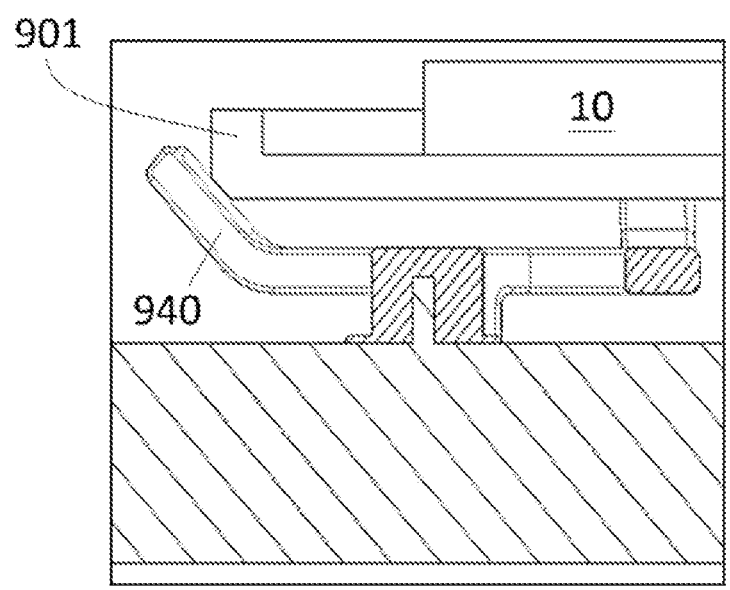
FIG. 16E is a cross-sectional view showing the lower-cover support mechanism along line FF as illustrated in FIG. 16A.

The function of a lower-cover support mechanism according to the present invention is not limited to supporting a reticle. FIG. 16A shows a reticle pod 900 (with the upper cover removed) and a reticle carrier 901 according to still another embodiment of the present disclosure, and FIG. 16B is a front view depicting the same embodiment. FIG. 16C is a perspective view showing a lower-cover support mechanism 940 according to the embodiment. FIG. 16D shows a lower cover and a lower-cover support mechanism 940 mounted thereon. FIG. 16E is a cross-sectional view showing the lower-cover support mechanism 940 along line FF as illustrated in FIG. 16A.

As shown in FIG. 16C, the lower-cover support mechanism 940 has a lateral extension portion 941, a first inclined arm 942a, and a second inclined arm 942b. The lateral extension portion 941 may function similarly as the securing portion described in the previous embodiments and can be connected with the lower cover 920; for example, the embodiment shown in FIG. 16E can be compared to the one shown in FIG. 12C. The first inclined arm 942a and the second inclined arm 942b each extend from the lateral extending portion 941. To be specific, each of the first inclined arm 942a and the second inclined arm 942b is composed of a flat extension part and an inclined extension part in this embodiment. FIG. 16D shows one lower-cover support mechanism 940 installed on the lower cover. As shown in FIG. 16D, the lateral extension portion 941 slightly extends toward the direction of the reticle carrier 901; meanwhile, the first inclined arm 942a and the second inclined arm 942b extend toward the periphery of the lower cover 920, and in particular, toward different edges of the lower cover 920. As shown in FIG. 16E, the first inclined arm 942a and the second inclined arm 942b allow the reticle carrier 901 to gradually slide down to be placed appropriately, avoiding a severe tilt of the reticle carrier 901.

In prior art, a slope, sphere or cylinder of a support mechanism supporting the reticle may have its abutting surface (which abuts against the reticle) worn down due to recurrent collisions. Such collisions may further wear down the support mechanism and result in unwanted particles. And when the wear is severe, the only solution is to replace the reticle pod or disassemble the reticle pod in a destructive way, which would be a waste of resources. As described in the various embodiments given above, the present invention provides a quick-release support mechanism, which can also provide a buffer when a reticle is being placed. When a support mechanism according to the present invention is worn down, it can be quickly replaced to reduce the generation of particles. In this way, there is no need to replace a whole reticle pod; thus, manufacturing costs and the waste of resources can both be reduced.

Although one or more embodiments have been provided to describe the present invention, it should be understood that the invention is not limited to the embodiments disclosed herein. For example, the structural form of a support mechanism according to the present invention is not limited to those disclosed in the embodiments. Also, the upper cover and the lower cover may be designed to have the same configurations; or alternatively, the upper-cover support mechanism and the lower-cover support mechanism may be designed to have different configurations. All modifications and similar arrangements without departing from the spirit of scope of the invention as defined in the appended claims should be interpreted in the broadest sense as covered by the present invention. The disclosure of the present invention also includes all the embodiments described in the following appended claims.

What is claimed is:

1. A reticle pod, comprising:
an upper cover having an abutting surface and a plurality of upper-cover mounting seats located on the abutting surface;
a lower cover having a carrying surface and a plurality of lower-cover mounting seats located on the carrying surface;
at least one first support mechanism having a supporting member extending upward for supporting a bottom of a reticle or a reticle carrier and a mounting member opposite to the supporting member, wherein the mounting member is configured to detachably connect to the corresponding lower-cover seat such that the first support mechanism is optionally loaded to the lower cover; and
at least one second support mechanism having an abutting portion for abutting a top of the reticle or the reticle carrier and a joint portion connecting with the abutting portion, wherein the joint portion is configured to detachably connect to the corresponding upper-cover mounting seat such that the second support mechanism is optionally loaded to the upper cover, wherein the upper-mounting seat has multiple protruding wing portions that is coupled to the corresponding joint portion;
wherein the joint portion of the second support mechanism has an opening having at least one first rib, the upper-cover mounting seat has at least one second rib, the opening is shaped to allow the second rib to slide over the first rib along a first rotation direction but prohibit the second rib rotates along a second rotation direction.

2. The reticle pod as claimed in claim 1, wherein the opening has a first channel that allows the corresponding upper-cover mounting seat enters therein or departs therefrom, the opening has a second channel that allows the corresponding upper-cover mounting seat rotates relatively to the opening.

3. A reticle pod, comprising:
an upper cover having an abutting surface and a plurality of upper-cover mounting seats located on the abutting surface;
a lower cover having a carrying surface and a plurality of lower-cover mounting seats located on the carrying surface; and
at least one support mechanism for contacting a bottom or a top of a reticle or a reticle carrier, the support mechanism is configured to rotatably detachably connected to the corresponding upper-cover mounting seat or the corresponding lower-cover mounting seat;
wherein a first support mechanism has an abutting portion for abutting a top of the reticle and a joint portion connecting with the abutting portion,
wherein the joint portion has an opening defined therethrough, the opening has at least one first rib, the upper-cover mounting seat has at least one second rib, the opening is shaped to allow the second rib to slide over the first rib along a first rotation direction but prohibit the second rib rotates along a second rotation direction.

4. The reticle pod as claimed in claim 3, wherein the upper-cover mounting seat has multiple protruding wing portions.

5. The reticle pod as claimed in claim 4, wherein the opening has a first channel that allows the corresponding upper-cover mounting seat enters therein or departs therefrom, the opening has a second channel that allows the corresponding upper-cover mounting seat rotates relatively to the opening.

6. The reticle pod as claimed in claim 3, wherein a second support mechanism is configured to rotatably detachably connect to the corresponding lower-cover mounting seat, the second support mechanism has a supporting member extending upward for supporting a bottom of the reticle and a mounting member opposite to the supporting member.

7. The reticle pod as claimed in claim 6, wherein the second support mechanism has a first inclined surface, a second inclined surface and a third inclined surface, the first inclined surface and the second inclined surface are configured to contact with the reticle while the third inclined surface is sandwiched between the first inclined surface and the second inclined surface for exhausting particles fell from the first and second inclined surfaces.

8. The reticle pod as claimed in claim 7, wherein the third inclined surface has multiple inclined surfaces.

9. A reticle pod, comprising:
an upper cover having an abutting surface and a plurality of upper-cover mounting seats located on the abutting surface; and
a support mechanism having an abutting portion for abutting a top of a reticle or a reticle carrier and a joint portion connecting with the abutting portion, wherein the joint portion is configured to detachably connect to the corresponding upper-cover mounting seat such that the support mechanism is optionally loaded to the upper cover, wherein the upper-cover seat has multiple protruding wing portions that couple to the corresponding joint portion;
wherein the joint portion of the support mechanism has an opening defined therethrough;
wherein the opening has at least one first rib, the upper-cover mounting seat has at least one second rib, the opening is shaped to allow the second rib to slide over the first rib along a first rotation direction but prohibit the second rib rotates along a second rotation direction.

10. The reticle pod as claimed in claim 9, wherein the opening has a first channel that allows the upper-cover mounting seat enters therein or departs therefrom, the opening has a second channel that allows the upper-cover mounting seat rotates relatively to the opening.

* * * * *